United States Patent [15] 3,697,818

Boursin [45] Oct. 10, 1972

[54] ENCAPSULATED CORDWOOD TYPE ELECTRONIC OR ELECTRICAL COMPONENT ASSEMBLY

[72] Inventor: Rene A. Boursin, Suresnes, France

[73] Assignee: Sovcor Electronique, Le Vesinet, France

[22] Filed: Jan. 25, 1971

[21] Appl. No.: 109,267

[30] Foreign Application Priority Data

Jan. 23, 1970 France......................7002443

[52] U.S. Cl....317/101 CW, 317/234 E, 174/DIG. 3, 339/17 CF

[51] Int. Cl................................................H05k 1/18

[58] Field of Search.......................317/101, 234 E; 174/68.5, DIG. 3; 336/96; 339/17 CF, 17 N

[56] References Cited

UNITED STATES PATENTS

| | | | |
|---|---|---|---|
| 3,505,570 | 4/1970 | Sprude et al. | 317/101 CW |
| 3,216,089 | 11/1965 | Dettman | 317/101 CW |
| 3,411,205 | 11/1968 | McGinley | 174/68.5 X |
| 3,427,715 | 2/1969 | Mika | 174/68.5 X |

OTHER PUBLICATIONS

IBM Technical Disclosure Bulletin, " Laminated Pocket for Tunnel Diodes," E. W. Harden, Vol. 4, No. 5, Oct. 1961, p. 46; 174- 685.

*Primary Examiner*—J. R. Scott
*Attorney*—Sughrue, Rothwell, Mion, Zinn & Macpeak

[57] ABSTRACT

A planar sheet of conductive material is cut or etched by any suitable means to define two parallel rows of parallel contact strips each of which is formed at its outermost end as a connector pin suitable for insertion into a printed circuit board. The innermost ends of each row define opposed contact tabs to which the opposed contact pins of an electronic component may be secured by soldering. One or more selected tabs in a row may be joined to each other by a connecting strip extending lengthwise along the row and selected tabs and/or connecting strips may be bent perpendicular to the planar sheet to define additional planes of contact attachment points parallel to the planar sheet to enable electronic components to be arranged in one or more parallel planes for connected between selected contact tabs in each row of contact strips. The connected components may then be encapsulated in a plastic material. The connector pin ends of each contact strip are then electrically separated from each other and bent into two planar rows perpendicular to the planar sheet for insertion into a suitable printed circuit plug board.

7 Claims, 13 Drawing Figures

INVENTOR.
RENÉ BOURSIN

BY
Sughrue, Rothwell, Mion, Zinn & Macpeak
ATTORNEYS

ENCAPSULATED CORDWOOD TYPE ELECTRONIC OR ELECTRICAL COMPONENT ASSEMBLY

BACKGROUND OF THE INVENTION

1. Field of the Invention

This invention relates to a device for the interconnection of separate, active or passive, electronic components, permitting the establishment of miniaturized electronic circuits with a very high component density.

The group of components thus assembled may perform a more or less complex electronic function and are arranged according to a well-defined geometry, with a generally parallelepipedic shape, so as to constitute a unitary device that can be plugged into printed circuit boards, of the conventional or appropriate type, provided for this purpose.

2. Prior Art

Interconnections by means of flat printed circuits are made by means of metallic conductors on a stratified insulating support of plastic material or the like, obtained by a metal layer such as copper which is deposited on the support. The electronic components are connected by tin soldering on the copper bands which themselves are tin-plated by contact with a tin bath in fusion, to the level of metallized holes traversing the conductor sections and the insulating support.

The interconnections may also be made with the help of two rather thin printed circuits, disposed in parallel planes, between which the separate components are arranged perpendicularly. The copper bands carried by the two printed circuits guarantee the interconnection of the components in sandwich fashion. This device is currently called "bundle wiring." It can be found in many variations. This device is denser than the preceding one and permits increased miniaturization of electronic circuits. The reliability is relatively satisfactory but one must still make the external connections of the functional circuit thus put together with the connector pins, which implies a new series of soldering between the outputs of the circuit and the pins, hence, a multiplication of the number of weak points.

Interconnections finally can be made on metallized ceramic supports and the configuration of the interconnection diagram is obtained by the serigraphic deposition of a solution, for example, a silver solution, on a support made of alumina. The conducting bands are calcined and they are then tin-coated in a bath. The active components are kept in place on the circuit by various procedures such as soldering on tin with compression, attaching by means of ultrasound, etc. All of these procedures are extremely delicate or they can—through a rise in the temperature—lead to considerable deterioration of the active components or the entire circuit assembly.

SUMMARY OF THE INVENTION

The device for the interconnection of electric components according to this invention is comprised of a metallic grid whose configuration is obtained by cutting a metal strip into the desired configuration which constitutes a part of the multiple parallel outputs or attachable sockets and conducting sections which can be bent perpendicularly to the general plane of the grid. These conducting sections then constitute "bus bars" to which are connected, by soldering, the terminals of the separate components which are arranged along one or more planes parallel to the plane of the initial grid and which are so chosen as to make up the desired operating circuit.

The three-dimensional system thus obtained is cast according to a modular geometry with the help of a resin to form a parallel-block from which extend the contact strips whose ends can be plugged into the holes in a printed circuit board of the conventional type or any other suitable type.

The above features, as well as the secondary features and the advantages which result from them, will appear in a more detailed fashion in the specification below, which discloses special forms of implementation, given here by way of example and without any restrictions, with reference to the attached drawings.

IN THE DRAWINGS

DETAILED DESCRIPTION

Figure 1A:
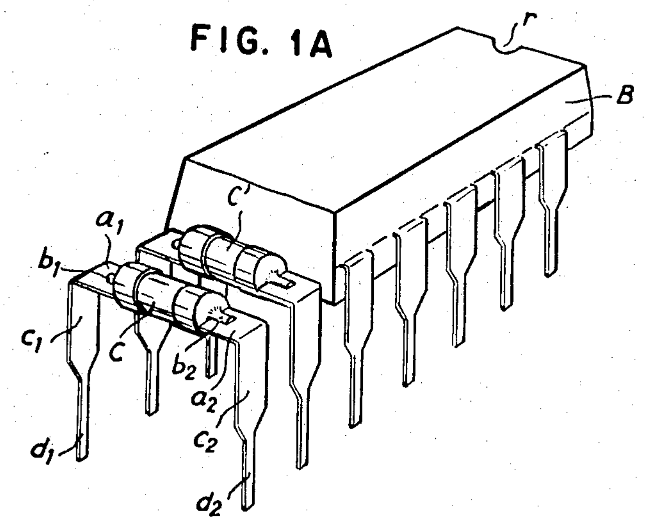
FIG. 1A represents, in a perspective view, a modular assembly of components insulated from each other.

Referring to FIG. 1A, a first form of a device according to this invention is shown which consists in a modular setup of an assembly of components C,C′, insulated from each other and constituting a device that can be plugged in.

The different components, such as C, are inserted between contact strips *c*1 and *c*2, which are opposite each other and which are arranged along two linear parallel and equidistant series. The component C is connected with the tabs *a*1 and *a*2 of the contact strips by electrically soldering terminals *b*1 and *b*2 of component C on the tabs that form contact studs. The lower portions *d*1 and *d*2 of the control strips form pins which can be plugged into the holes of a printed circuit board. The assembly of components thus put together is molded within plastic material forming a block B with positioning reference notch *r* to facilitate the automatic insertion and positioning of the modules.

Figure 1B:
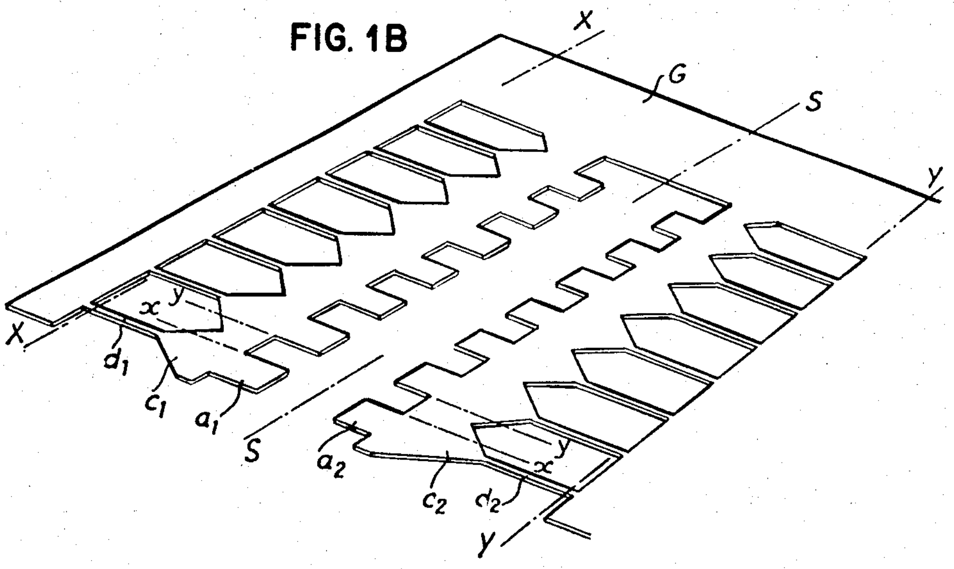
FIG. 1B represents the geometric configuration adopted for the grid, enabling one to obtain the modular assembly in FIG. 1A.

Referring to FIG. 1B, the geometric configuration is illustrated which is adopted for the grid used in the preceding assembly. Starting with a sheet of metal in the form of band G which is cut along the desired configuration by means of chemical etching or mechanical cutting, the central portion of the band is perforated so as to provide the necessary locations for housing the components C. The lateral portions are notched to define the contact strips *c*1, *c*2 and the centering pins *d*1, *d*2, which can be plugged into the printed circuit. Thus, the assembly of the geometrical configuration is symmetrical with respect to the axis S S and the cut out band will hereinafter be designated by the term "grid."

The technique for producing the device according to the invention is set forth hereinafter.

The components, such as C, are placed on the grid with the terminals of the components resting on tabs *a*1 and *a*2. The terminals are then connected thereto by means of electric soldering. The assembly is then molded into a thermoplastic or heat-hardenable material forming the block B. Tabs *a*1 and *a*2 of the contact strips are then insulated from each other by cutting along parallel lines, such as *xx* and *yy*. Similarly, a cut is made along XX and YY, to release the pins such as *d*1 and *d*2 which are folded back along two parallel planes which are perpendicular to the plane of the level of components. The final module is then ready.

Figure 2:
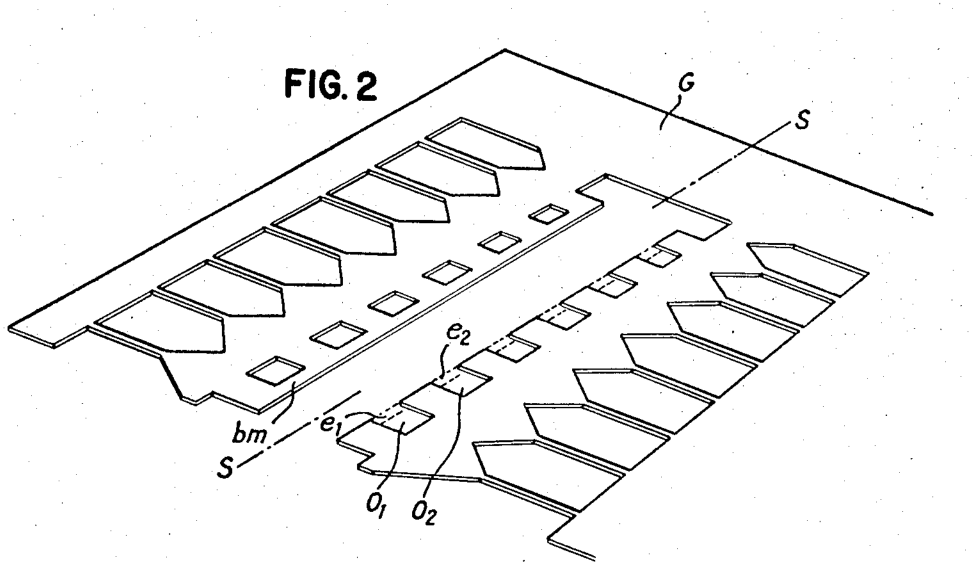
FIG. 2 represents the configuration adopted for the grid, enabling one to connect all components through a common point.

Referring to FIG. 2, another configuration of grid G is shown, whose geometry is substantially symmetrical with respect to S S, but with the connecting bars, such as *e*1, *e*2 across the openings *o*1, *o*2 cut off, whereas the corresponding portions on the opposite side of the grid have been preserved to constitute a bus bar *bm*, thus connecting all of the terminals of the components to each other which are situated on the corresponding side. The components, which are then soldered to the tabs will thus have a common point. It is noted that they are interconnected in the plane of the grid.

The same technology can be applied to establish common points on either side of the components by linking the tabs of the contact strips by means of interconnection bars, so as to provide parallel connection of the components, two by two, three by three, or *n* by *n*.

Figure 3A:
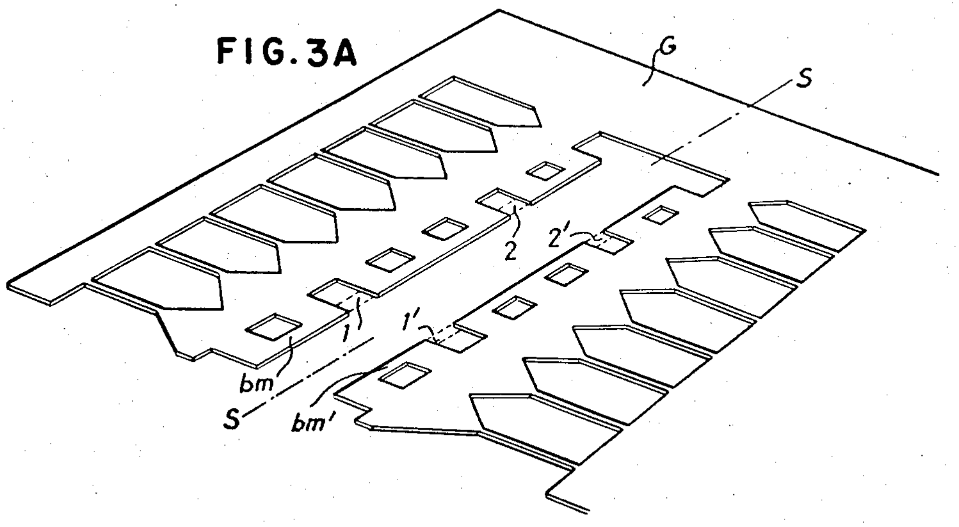
FIGS. 3A and 3B represent the stages in setting up a device in which the components and interconnections are situated in one and the same plane.
Figure 3B:
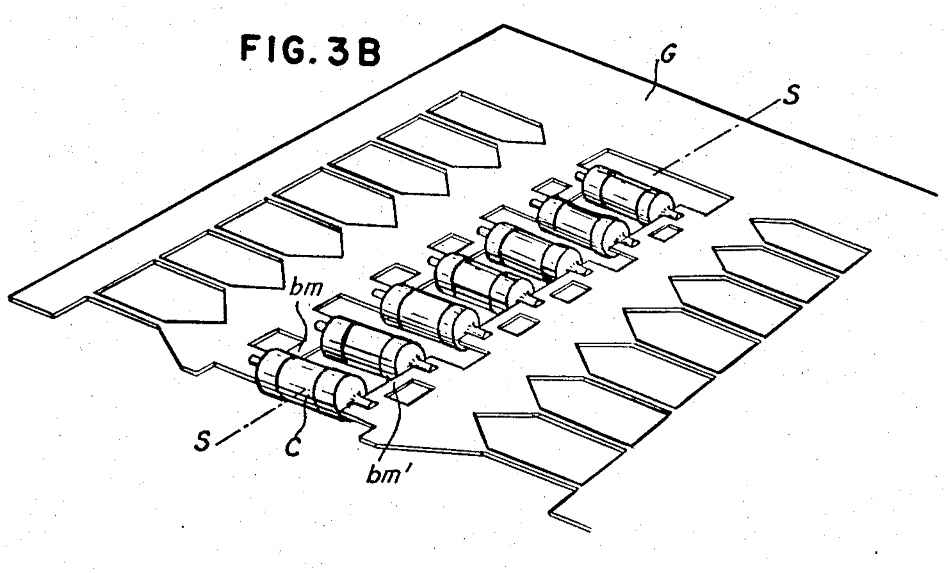

Referring to FIG. 3A, it is seen that, by sectionalizing the bars *bm* and *bm'* at 1, 2 and 1', 2', respectively, it is possible to interconnect, parallel and successively, two, three, and then two components. In FIG. 3B an intermediate stage is shown in putting together the corresponding device, after soldering of the components C and before the casting of the block. The other operations of finishing the device are the same as before.

The geometric configuration of the grid, made by cutting the metal band, can be designed so as to make up devices in which the components are all in one and the same plane, whereas the interconnections are made both in this plane and in different planes.

Figure 4A:
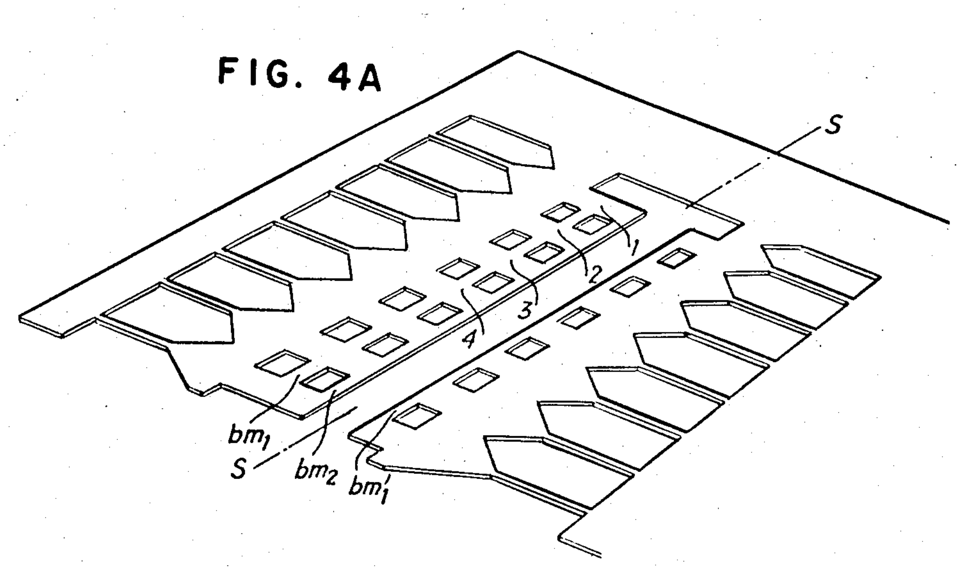
FIGS. 4A–4C represent the stages in making a device in which the components are situated in one and the same plane and in which the interconnections are situated in different planes.
Figure 4B:
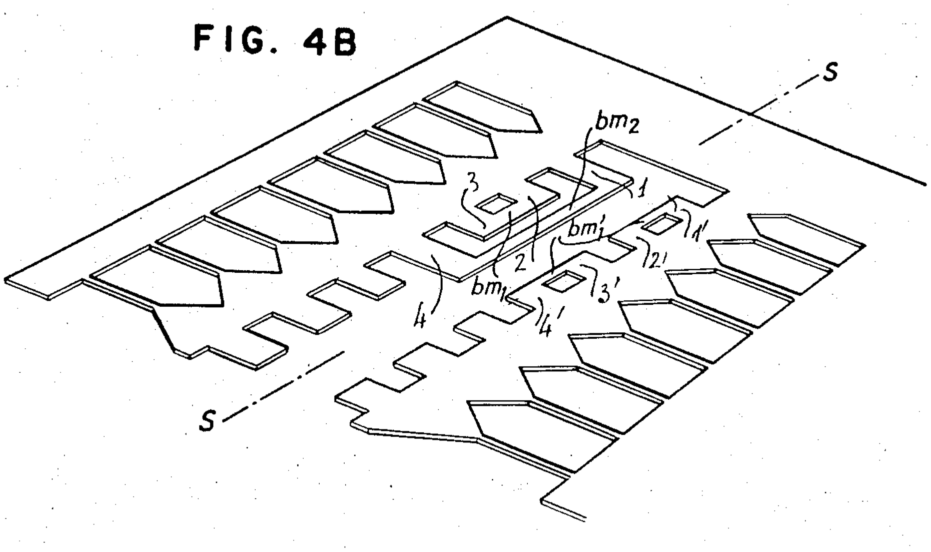
Figure 4C:
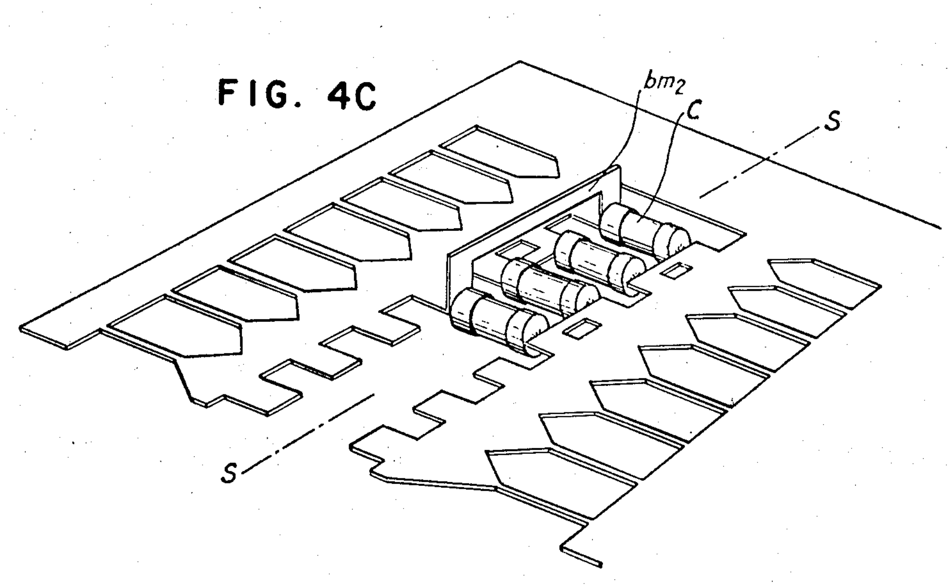

Referring to FIGS. 4A to 4C, the successive stages in making such a device are illustrated. To put up a second interconnection level, the grid is cut constituting, on one side of the axis S S, two bus bars *bm*1 and *bm*2, and, on the other side, a single bus bar *bm'*1 (FIG. 4A). By selectively cutting the bus bars along the outlines indicated on FIG. 4B, an interconnection can be made between the contact studs 1 and 4, on the one hand, and 2 and 3, on the other hand, to the left of the axis S S, and, respectively, 1' and 2', on the one hand, 3' and 4', on the other hand, to the right of the axis S S. The portion of the bus bar *bm*2, which has thus been retained is bent upwardly so as to be lined up along a plane perpendicular to that of the grid (FIG. 4C) and thus permits the placement of components, such as C, in the central portion of the grid. These separate components are then soldered on the grid. The circuit thus represented by way of example in FIG. 4C is a resistive network, such as an attenuator in a closed coop. The operations of molding, cutting and bending the pins are then performed as indicated earlier.

The geometric configuration of the grid, constituted by cutting the metal band, can be designed so as to make up devices in which the components and the interconnections are situated in different planes, thus permitting the assembly of complex electronic circuits.

Figure 5A:
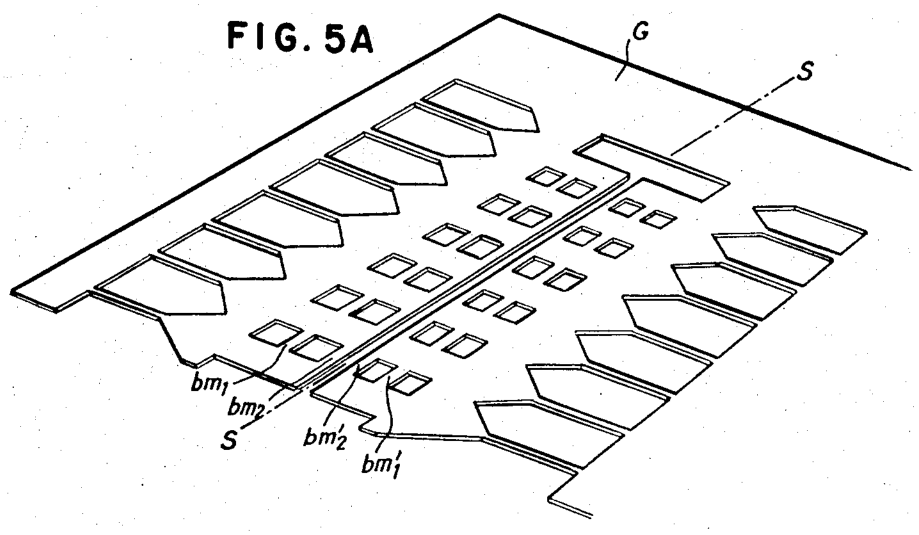
FIGS. 5A–5C represent the stages in making a device in which the components and the interconnections are in several planes.
Figure 5B:
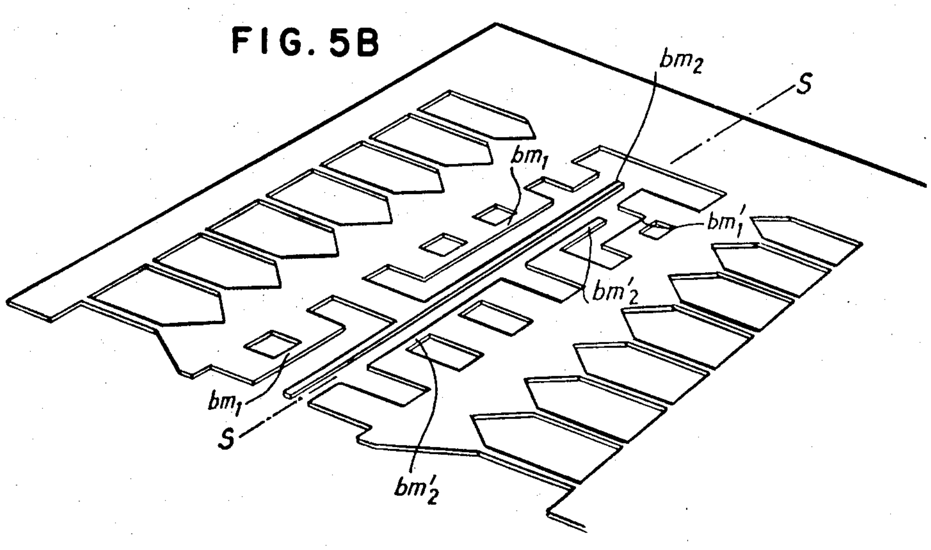
Figure 5C:
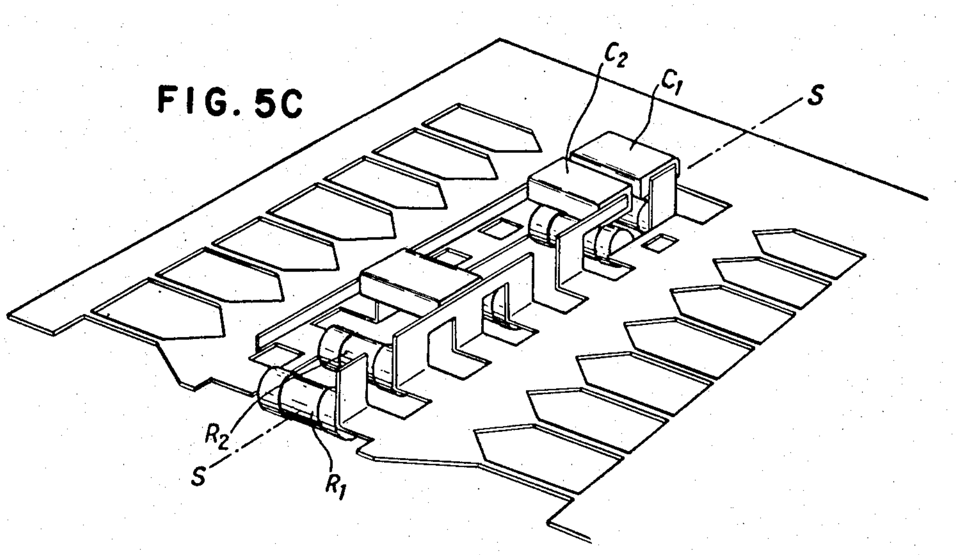

In FIGS. 5A–5C, the successive stages in making such a device are illustrated. In the base plate, or grid G, for example, a configuration is formed with four columns of holes, distributed symmetrically with respect to S S, outlining the bus bars *bm*1, *bm*2, *bm'*1, bm'2, respectively (FIG. 5A). Then certain sections are cut, so as to define a configuration for the bars which takes into account the electric diagram. The geometry may then have the form in FIG. 5B where bus bars *bm*1 and *bm'*2 have been broken up into several conducting sections, bar *bm*2 has been retained in its entirety, and bar *bm'*1 has been sectionalized over almost its entire length. The bars that are closest to the axis of symmetry are then bent upwardly in the central portion to provide the space necessary for the placement of the various separate components. FIG. 5C shows the various components such as $C_1$, $C_2$, $R_1$, $R_2$ . . . whose pins are attached by electrical soldering according to two stages. A first plane of attachment is made up by the plane of bars $bm_1$ and $bm'_1$, which are disposed in the plane of the base plate, where the soldering is done on the level of the top of the plug-in contact strips.

A second attachment plane, parallel to the preceding one, is situated above, on the level of the middle part of the portions of bus bars *bm*2 and *bm'*2 which have been bent upwardly.

Thus a modular element is obtained with two levels of separate components and two interconnection levels. The operations of molding, cutting and bending the pins, takes place as before.

Thus, the production process described in the above example can be generalized and permits the interconnection of components contained in *p* different planes at *q* different levels to obtain more and more complex modules.

Figure 6:
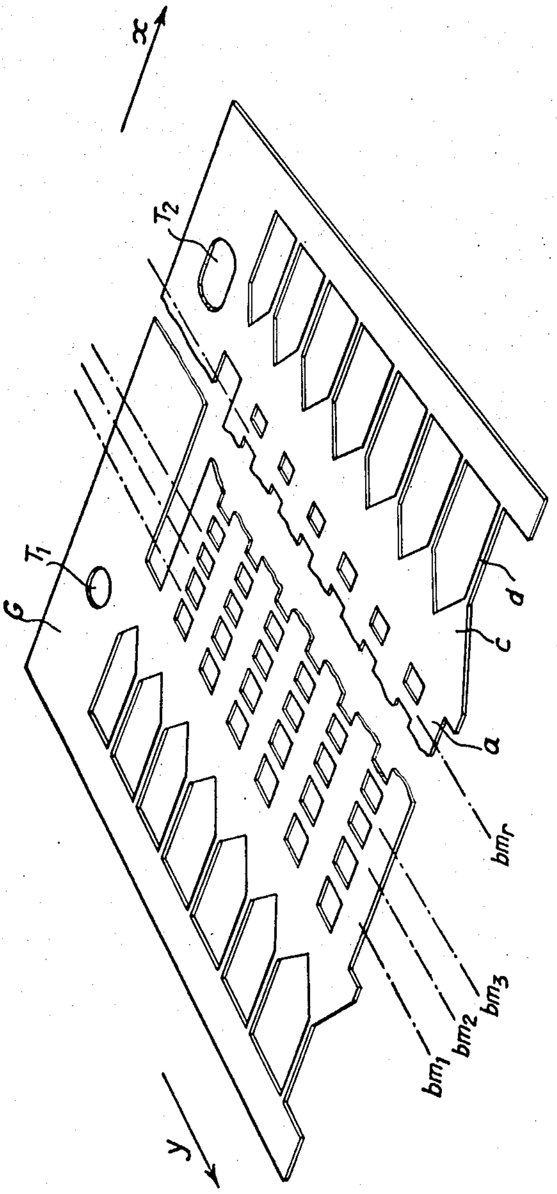
FIG. 6 represents the general configuration of a grid intended to make it possible—after cutting and bending–to put together a device with any number of levels and complex interconnections.

FIG. 6, shows a grid G involving a configuration with $n + 1$ columns of holes, with a polygonal outline (preferably rectangular), delimiting *n* bus bars *bm*1 to *bmn* which, after making the suitable geometric layout and bending the portions preserved, serves as interconnection bars permitting the attachment and connection of the components, along more and more numerous levels, so as to perform complex electronic functions. Positioning holes $T_1$ and $T_2$ are provided along the direction *x*, for locating and adjusting the photo-engraving masks used to obtain the interconnection bars of the components.

Figure 7:
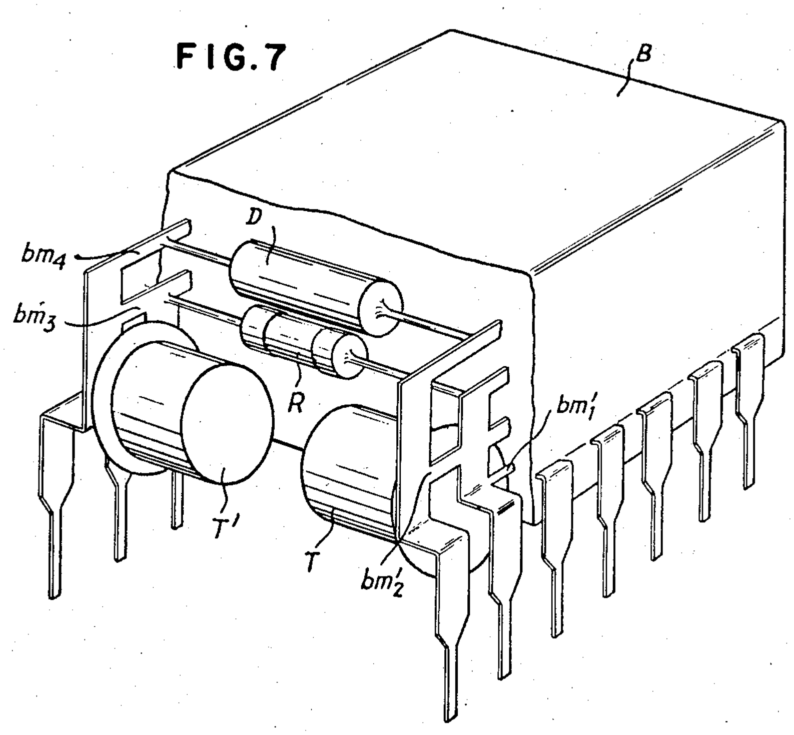
FIG. 7 represents a perspective view of a device according to the invention, with numerous levels of components, obtained on the basis of the grid in FIG. 6.

By way of example, there is shown in FIG. 7 a modular element with four levels of component connections, made up of resistances R, transistors T,T′, diodes D, condensers, and coils (not shown). It is noted that as the number of component planes increases gradually, the interval between the two rows of plug-in pins increases. To insert the circuit in a standard printed circuit board, it suffices to select, for the geometry of the base plate, intervals permitting the obtaining of multiples of the pitch of the standard printed circuit boards.

The modular configuration shown in FIG. 6, in the most advanced form, can be repeated in $x_0$ and $y_0$ numbers of the corresponding base pattern, along the two principal directions $x$ and $y$ of this figure. Starting from this base grid, the necessary cuts are made to obtain the suitable geometric layout of the interconnection bars, followed by the bending of the portions of the bars thus separated along the $q$ levels of interconnection. The components in the $p$ planes are then soldered and molded into the various modular blocks which are then separated. Finally, the plug-in pins are bent and inserted into the perforations of the printed circuit board.

Thus, it is seen that this new industrial product is highly capable of large-scale industrial production since it is possible to obtain through easily automated processes involving entire boards of more or less well developed circuits, for example, dipoles, quadripoles, attenuators, filters, trigger circuits, delay lines, decoding circuits, etc.

The device for the interconnection of separate components according to this invention thus permits the association of separate, passive or active, components to make up varied circuits with a small or minimum number of soldering points (component outputs), which gives the device thus constituted one of the highest degrees of reliability.

Although the description presented here was illustrated by some particular forms of implementation, it is clear that numerous detail changes can be made in the basic geometric layout without going beyond the framework of the invention.

What is claimed is:

1. A device for interconnecting electronic components in modular form comprising a planar sheet of conductive material having two parallel rows of parallel contact strips, each of said strips at the outermost ends thereof defining a connector pin, each of said strips at the innermost ends thereof defining opposed contact tabs to which the opposed contact pins of an electronic component may be secured, connecting bar means selectively interconnecting at least one group of said contact tabs in at least one of said rows to provide at least one common contact point for at least two electrical components to be secured between said rows of contact strips each of said connector pins being mechanically separated from the other connector pins.

2. A device as set forth in claim 1 further comprising a plurality of said connecting bar means associated with at least one of said rows, said plurality of connecting bar means being disposed parallel to each other whereby the connecting bar means closest to the other of said rows may be bent upwardly out of the plane of said planar sheet to facilitate the connection of electronic components between opposed tabs in the plane of said sheet.

3. A device as set forth in claim 1 further comprising a plurality of said connecting bar means associated with each of said rows, said plurality of connecting bar means being disposed parallel to each other whereby the connecting bar means in each of said rows closest to the other row may be bent upwardly out of the plane of said planar sheet to provide at least one additional plane of contact points so that additional electronic components may be connected between said contact strips in a plurality of parallel planes.

4. A modular electronic circuit arrangement comprising two rows of contact strips disposed parallel to each other in two parallel planes, each of said strips in each row comprising mechanically separated connecting pin means disposed in the plane of said row and contact tab means disposed at right angles thereto in opposed coplanar relation with the tab means of the strips in the other row, a plurality of electronic components each disposed in the plane of said tab means and each connected to opposed tab means and means encapsulating all of said components and tab means into a single block.

5. An arrangement as set forth in claim 4 further comprising connecting bar means connecting at least one selected group of tab means in at least one of said rows.

6. An arrangement as set forth in claim 5 further comprising at least one additional connecting bar means disposed parallel to and perpendicular to said first mentioned connecting bar means connecting additional tab means in the same row.

7. An arrangement as set forth in claim 5 further comprising at least one additional connecting bar means disposed parallel to said first mentioned connecting bar means and connecting a selected group of tab means in the other of said rows, said first mentioned connecting bar means and said additional connecting bar means being disposed perpendicular to the respective tab means and additional electronic components connected therebetween in a plane parallel to the plane of said tab means.

* * * * *